(12) United States Patent
Kluge et al.

(10) Patent No.: US 7,158,590 B2
(45) Date of Patent: Jan. 2, 2007

(54) GAIN CONTROL IN WIRELESS LAN DEVICES

(75) Inventors: Wolfram Kluge, Dresden (DE); Jörg Borowski, Dresden (DE); Frank Poegel, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 743 days.

(21) Appl. No.: 10/184,408

(22) Filed: Jun. 27, 2002

(65) Prior Publication Data
US 2003/0161417 A1    Aug. 28, 2003

(30) Foreign Application Priority Data
Feb. 27, 2002    (DE) ............................. 102 08 415

(51) Int. Cl.
    *H04L 27/08*    (2006.01)
(52) U.S. Cl. ................. 375/345; 455/234.1; 455/245.1
(58) Field of Classification Search ........ 375/148–149, 375/316, 317, 319, 345; 455/136, 138, 232.1, 455/234.1, 234.2, 245.1
See application file for complete search history.

(56) References Cited

U.S. PATENT DOCUMENTS

| | | | |
|---|---|---|---|
| 4,191,995 A | 3/1980 | Farrow | |
| 4,989,074 A | 1/1991 | Matsumoto | |
| 5,016,205 A * | 5/1991 | Shumway | 708/200 |
| 5,379,075 A | 1/1995 | Nagasawa et al. | |
| 5,451,948 A | 9/1995 | Jekel | |
| 5,630,221 A | 5/1997 | Birleson | |
| 5,732,341 A | 3/1998 | Wheatley, III | |
| 5,745,531 A | 4/1998 | Sawahashi et al. | |
| 6,081,565 A * | 6/2000 | Marandi et al. | 375/345 |
| 6,088,583 A * | 7/2000 | Shimizu et al. | 455/235.1 |
| 6,735,422 B1 * | 5/2004 | Baldwin et al. | 455/232.1 |
| 6,763,228 B1 | 7/2004 | Prentice et al. | |
| 6,775,337 B1 * | 8/2004 | Janky et al. | 375/345 |

FOREIGN PATENT DOCUMENTS

| | | |
|---|---|---|
| DE | 199 56 462 | 11/2000 |
| DE | 100 09 443 | 8/2001 |
| WO | 98/35477 | 2/1997 |

OTHER PUBLICATIONS

Translation of Official Communication dated Jun. 16, 2005.

* cited by examiner

*Primary Examiner*—Khanh Tran
(74) *Attorney, Agent, or Firm*—Meyertons Hood Kivlin Kowert & Goetzel, P.C.; B. Noël Kivlin

(57) ABSTRACT

A signal pre-processing device particularly in wireless LAN devices is provided that comprises an AGC (Automatic Gain Control) unit, an ADC (Analog-to-Digital Converting) unit and a normalization unit. The AGC unit amplifies a received analog input signal and outputs an amplified analog signal. Further, it automatically controls an amplification gain when amplifying the analog input signal. The ADC unit receives the amplified analog signal, converts it into a digital signal and outputs the digital signal. The normalization unit is receives the digital signal, applies a normalization function to the digital signal and outputs the normalized digital signal. Thus, less precise AGC units can be used, thereby reducing production costs as well as the size and complexity of the AGC unit. Further, shorter circuit development times are obtainable.

39 Claims, 2 Drawing Sheets

GAIN CONTROL IN WIRELESS LAN DEVICES

BACKGROUND OF THE INVENTION

1. Field of the Invention

The invention generally relates to wireless LAN (Local Area Network, WLAN) systems and in particular to gain controlled wireless LAN devices such as receivers, access points or stations, and corresponding methods that provide or use a digital signal having a normalized signal level.

2. Description of the Related Art

A wireless LAN system is a flexible data communication system that allows a remote user's mobile device to connect to an access point of the network (wired LAN), without having the requirement for the mobile device of being physically attached to the network, as well as to connect to a further remote user device. Thus the mobile device in a wireless LAN system provides for wireless mobility and additionally achieves the common functionality of wired data transfer as well as application and data access via the network.

As illustrated in FIG. 1, a wireless LAN 1 provides connection for mobile devices 4, 5, which are also referred to as (mobile) stations hereafter. As indicated by arrows, the mobile devices 4, 5 may communicate with an access point 3, which is connected to a wired network 2. Further the mobile devices 4, 5 can interconnect each other as well. Hence, data transfer between one of the mobile stations 4, 5 and one of wired devices 6, 7 via the access point 3 or another one of the mobile stations 4, 5 can be established.

Presently, Radio Frequency (RF) and Infra Red (IR) transmission techniques are most commonly used in wireless LANs. The industry specification IEEE 802.11 provides a standard for wireless LAN systems and products and describes direct sequence spread spectrum (DSSS) as one possible modulation technique for RF signals. Particularly upon using DSSS modulation, but also when using other modulation techniques, a wireless LAN device internally requires a stable signal level for correctly evaluating a received signal. Hence, a change in the quality of the received signal has to be compensated before further evaluating the signal. For this purpose automatic gain control (AGC) circuits are provided.

Frequently, AGC circuits are analog circuits that receive an analog signal and generate a gain control signal for a variable gain amplifier to amplify the signal. However, an analog AGC circuit typically requires a complex structure of subunits for generating the gain control signal. Particularly in view of the desire to reduce the size of mobile devices this is a major disadvantage of analog AGC circuits. Additionally, analog AGC circuits suffer from their relatively long reaction time to fast or significant changes in the input signal.

Further AGC circuits exist that comprise digital units to calculate the AGC control signal. These circuits however, due to the quantization of their internal values and the corresponding quantization of the AGC control signal, typically add some kind of oscillation to the output signal of the variable amplifier. The oscillation may hinder the correct evaluation of the amplified signal.

Hence, conventional AGC circuits for wireless devices are expensive high quality parts, since they need to be built in a complex structure for providing a precise output signal level. Reducing the requirements on the AGC circuits would however decrease system performance and reliability of the wireless LAN system.

SUMMARY OF THE INVENTION

Accordingly, an improved signal pre-processing device, a wireless LAN receiver, a signal processor and a signal pre-processing method are provided which impose reduced requirements on the AGC circuit, thereby significantly reducing manufacturing costs substantially without decreasing system performance or reliability.

In one embodiment, a signal pre-processing device for providing a digital output signal based on an analog input signal is provided. The device comprises an AGC unit, an ADC (Analog-to-Digital Converting) unit and a normalization unit. The AGC unit is for receiving the analog input signal, amplifying the analog input signal and outputting an amplified analog signal. The AGC unit further is arranged for automatically controlling an amplification gain when amplifying the analog input signal. The ADC unit is connected to the AGC unit for receiving the amplified analog signal, converting it into a digital signal and outputting the digital signal. The normalization unit is connected to the ADC unit for receiving the digital signal, applying a normalization function to the digital signal and outputting a normalized digital signal.

In another embodiment, a wireless LAN receiver is provided comprising an antenna for receiving a radio signal and outputting a corresponding analog signal, and an AGC unit, an ADC unit and a normalization unit. The AGC unit is connected to the antenna for receiving the analog signal, amplifying the analog signal and outputting an amplified analog signal. The AGC unit further is arranged for automatically controlling an amplification gain when amplifying the analog signal. The ADC unit is connected to the AGC unit for receiving the amplified analog signal, converting it into a digital signal and outputting the digital signal. The normalization unit is connected to the ADC unit for receiving the digital signal, applying a normalization function to the digital signal and outputting a normalized digital signal.

In a further embodiment a signal processor for processing an analog input signal is provided. The signal processor comprises an AGC unit, an ADC unit, a normalization unit and a DSP (Digital Signal Processing) unit. The AGC unit is for receiving the analog input signal, amplifying the analog input signal and outputting an amplified analog signal. The AGC unit further is arranged for automatically controlling an amplification gain when amplifying the analog input signal. The ADC unit is connected to the AGC unit for receiving the amplified analog signal, converting it into a digital signal and outputting the digital signal. The normalization unit is connected to the ADC unit for receiving the digital signal, applying a normalization function to the digital signal and outputting a normalized digital signal. The DSP unit is connected to the normalization unit for receiving the normalized digital signal and digitally processing the normalized digital signal.

In a further embodiment a method for a pre-processing an analog input signal in a wireless LAN reception device is provided. The method comprises: receiving the analog input signal, amplifying the analog input signal, thereby automatically controlling an amplification gain, converting the amplified analog signal to a digital signal, applying a normalization function to the digital signal to provide a normalized digital signal, and outputting the normalized digital signal.

BRIEF DESCRIPTION OF THE DRAWINGS

The accompanying drawings are incorporated and form a part of the specification for the purpose of explaining the principles of the invention. The drawings are not to be construed as limiting the invention to only the illustrated and described examples of how the invention can be made and used. Further features and advantages will become apparent from the following, more particular description of the invention, as is illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

Figure 1:
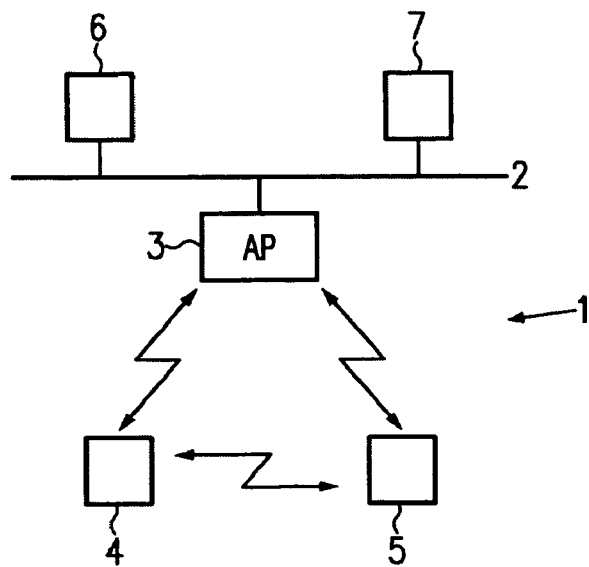
FIG. 1 illustrates the interoperation between a wireless LAN and a wired LAN.
Figure 2:
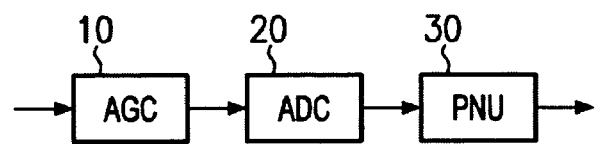
FIG. 2 illustrates an embodiment of a signal pre-processing device.

FIG. 2 illustrates a pre-processing device for use in a wireless LAN node such as a station or access point. The pre-processing device comprises an AGC unit 10, an ADC unit 20 and a power normalization unit 30. The AGC unit 10 receives an analog input signal for amplifying same under gain control. Accordingly it outputs an amplified analog signal. The ADC unit 20 is connected to the AGC unit 10 for receiving the amplified analog signal. The ADC unit 20 converts the received analog signal into a digital signal and outputs same. The power normalization unit 30 is connected to the ADC unit 20, receives the digital signal and applies a power normalization function to the received digital signal. Then it provides or outputs a normalized digital signal.

In the pre-processing device illustrated in FIG. 2, the AGC unit is adapted to provide an output which falls within the range of possible input values of the ADC unit 20. The AGC unit 10 however does not have to be provided in such a way that its amplified output is perfectly constant or well-defined. This is achieved by the additional power normalization unit 30. The applied power normalization function guarantees a constant average output power level near a target power level of the normalized digital signal. Furthermore, the power normalization unit 30 may be adapted for limiting the bit-width of the normalized digital signal, for example by considering the bit-width of a target unit receiving the normalized digital signal. A bit-width corresponds to the number of digits required to represent the signal in a digital form. This will be described in more detail below.

Figure 6:
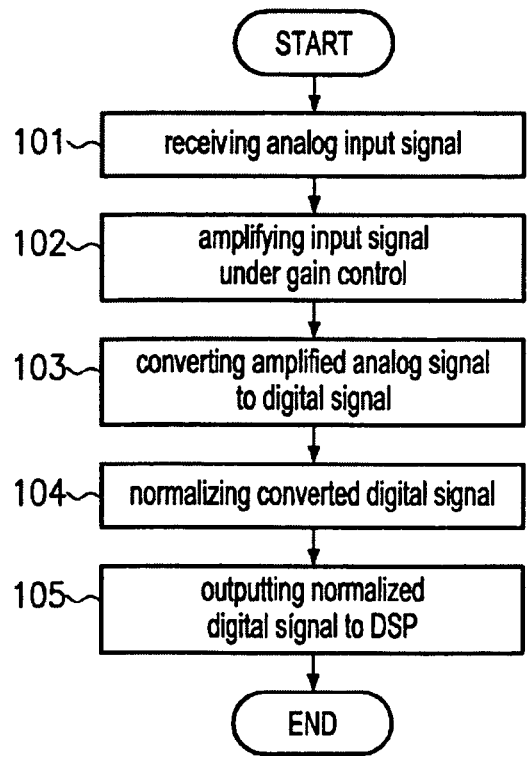
FIG. 6 illustrates a method performed in a wireless LAN device according to an embodiment.

A method for providing an improved digital output signal in a wireless LAN reception device is illustrated in FIG. 6. In a first step 101, an analog input signal is received e.g. from an antenna. Subsequently, the analog input signal is amplified (step 102), wherein this step of amplifying is automatically controlled with regard to the amplification gain. The amplified analog signal is converted into a digital signal in step 103. For providing a stabilized output signal, the digital signal is normalized in step 104 and the normalized digital signal is finally provided as the output of the wireless LAN reception device (step 105). This method can for example be performed when using the pre-processing device illustrated in FIG. 2. Accordingly, based on features set forth for the above and below described apparatus, various corresponding embodiments of this method are possible.

Figure 3:
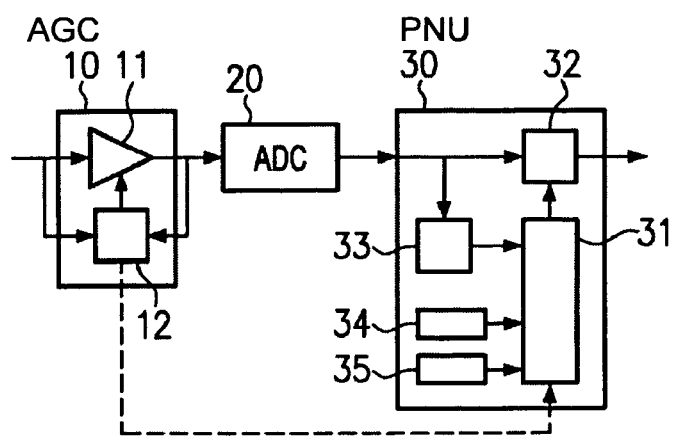
FIG. 3 illustrates the signal pre-processing device of FIG. 2 in a more detailed view.

FIG. 3 illustrates a more detailed view of the pre-processing device of FIG. 2. The AGC unit 10 comprises a variable gain amplifier 11 and a gain controller 12. The variable gain amplifier 11 receives an analog input signal for amplifying same in accordance with a gain control signal received from said gain controller 12. The gain controller 12 may receive the analog input signal and/or an output signal of the variable gain amplifier 11 for generating the gain control signal. The gain controller may be provided as an analog or digital circuit.

The amplified analog signal is transmitted to the ADC unit 20 for being converted into a digital signal which is then output to the power normalization unit 30. Therein a multiplication unit 32 receives the digital signal for multiplying same in dependency to a normalization control signal. An evaluation unit 33 receives the digital signal, determines an average power level thereof and provides power level information to control unit 31. By comparing this received information with a target power level which is stored in a first storage 34, the control unit 31 determines the required normalization control signal. Particularly when using target signal level as an optimum signal level of a DSP, to which the pre-processing unit outputs the normalized digital signal, a suitably adapted digital output signal can be provided. In an embodiment, the control unit 31 may be formed by a divider calculating the normalization control signal as a ratio between the target power level and the signal power level. Further, there may be provided a square root calculator to generate an input to the multiplication unit 32 based on the power level ratio.

The power normalization unit 30 may be adapted to predetermined properties of the AGC unit 10 and the ADC unit 20. The AGC unit 10 has a certain average power level which may deviate from a target power level of the pre-processing device as a whole. Accordingly, the power normalization unit 30 may calculate a ratio between the target power level and the average power level and use this ratio as a default normalization gain upon initially applying or restarting application of the normalization function. Further the AGC unit 10 reacts in a defined slower or faster manner to changes in the signal level or the signal power. Correspondingly, the power normalization unit 30 may be adapted to this reaction property of the AGC unit 10 by using either more or less digital signal values for calculating an average signal power. Finally, the ADC unit 20 has a certain maximum bit-width of its digital output signal. Consequently, the power normalization unit 30 may limit its normalization function or the corresponding algorithm e.g. to internally required maximum values and used or unused bits. As apparent the above adaptations to predetermined properties are not limited to the embodiment of FIG. 3, but are also applicable to the embodiment of FIG. 2.

Turning now back to FIG. 3 a second storage 35 is provided that stores predetermined values indicating predefined properties of the pre-processing device. In addition or as an alternative to the properties of the ADC unit 10 or the AGC unit 20 for which several examples already have been given above, the second storage 35 may store the default normalization control signal or an upper limit bit-width for the output normalized digital signal. In another embodiment, the upper limit bit-width may have a predetermined value and a maximum power normalization gain is stored instead. Thus, the power normalization unit 30 may be arranged to adapt the applied normalization function in response to the predetermined values stored in the second storage 35. In particular, a maximum bit width of the digital signal, a number of digital values of said digital signal used for determining a signal level or the default normalization control signal may be used as the predetermined values, and may be adapted to properties of the AGC unit 10 and/or the ADC unit 20. In one embodiment the signal pre-processing device is arranged to limit the normalized digital signal in its bit-width particularly in accordance with the stored upper limit bit-width.

Furthermore, a modification of this embodiment is indicated in FIG. 3 with dotted lines. The gain controller 12 may provide an AGC control value to the control unit 31. This AGC control value may represent the current state of the AGC unit 10 and may be used for improving the determination of the normalization control signal in the control unit 31. This allows in particular to reduce the reaction time of the pre-processing device to fast changes of the signal level. The AGC control value may be provided in form of the gain control signal, but may also indicate an error state of the AGC unit 10.

It is noted that several further embodiments of the power normalization unit 30 are possible, in which for example the multiplication unit 32 may be replaced by a division unit. Further the evaluation unit 33 may be integrated into the control unit 31. In another embodiment, the evaluation unit 33 or the control unit 31 may be arranged to receive and evaluate the normalized digital signal.

Figure 4:
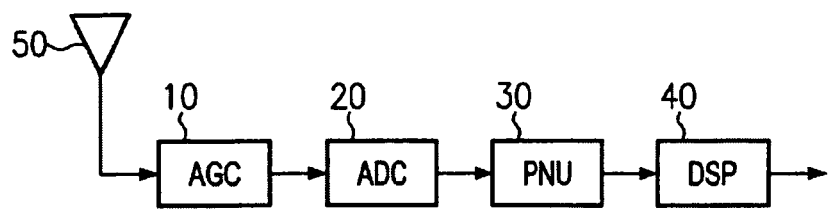
FIG. 4 illustrates an arrangement according to an embodiment, usable in a wireless LAN receiver or access point.

In FIG. 4, an arrangement is illustrated that can be a wireless LAN receiver as well as a signal processor for use in a wireless LAN station or access point. This will be described in more detail in the following.

Discussing first the wireless LAN receiver, there is provided an antenna 50, an AGC unit 10 connected to the antenna for receiving an analog input signal therefrom, an ADC unit 20 connected to the AGC unit 10, and a power normalization unit 30 connected to the ADC unit 20. The wireless LAN receiver and particularly the AGC unit 10 or the power normalization unit 30 may be adapted to certain properties of the antenna, for example the average intensity of received signals.

Referring to the signal processor mentioned above, for use in a wireless LAN station or access point, an AGC unit 10, an ADC unit 20, a power normalization unit 30 and a DSP unit 40 is again provided. It is noted that the units shown in FIG. 4 may be the same as described above with reference to FIGS. 2 and 3. Thus, the corresponding advantages which may be attained may also apply to the embodiment illustrated in FIG. 4.

Additionally, in the signal processor discussed above, the DSP unit 40 may have strict requirements with respect to the bit width, filter characteristics or signal thresholds, since it receives a well defined normalized digital signal from the power normalization unit 30. Thus, the arrangement illustrated in FIG. 4 may allow use of a rather imprecise AGC unit 10 without the need to accordingly adapt the implementation of the DSP unit 40. This reduces the time needed to develop the respective circuiting in the wireless LAN device manufacturing process.

Moreover, the power normalization unit 30 may be designed or selected in accordance with certain properties of the AGC unit 10, the ADC unit 20 and/or the signal requirements of the DSP unit 40. Hence, any DSP unit 40 may be combined with any AGC unit 10 only by adapting the power normalization unit 30. This adds flexibility to the circuit design process and reduces the time for developing and producing such devices.

In a modification of this embodiment, the power normalization unit 30 automatically adapts the normalization function to the value of a predetermined variable which represents a property of the AGC unit 10. For example, the power normalization unit may consider a theoretical maximum bit width of the digital signal when applying a normalization function to the digital signal. This value may be calculated for the specific AGC unit 10 and ADC unit 20 used in the processing device.

Figure 5:
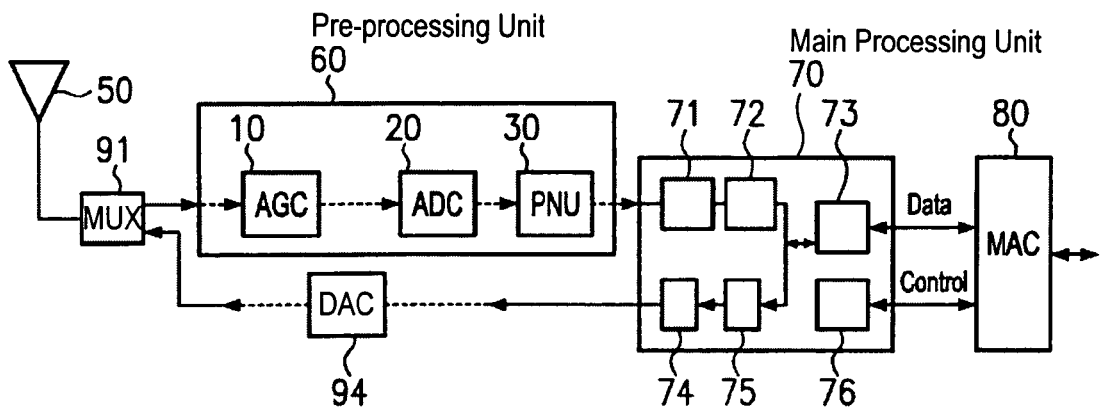
FIG. 5 illustrates an embodiment of a wireless LAN transceiver.

FIG. 5 illustrates a wireless LAN transceiver that receives and transmits data via an antenna 50. The transceiver comprises a switch or multiplexer 91 for multiplexing between a reception path and transmitted signals from a transmission path. Data to be transmitted are converted to analog signals in a DAC (Digital-to-Analog converting) unit 94 in the transmission path for being transmitted as a radio signal via the antenna 50.

A pre-processing unit 60 in the reception path comprises at least an AGC unit 10, an ADC unit 20 and a power normalization unit 30. In the present, 802.11 specific embodiment, the pre-processing unit 60 provides a received signal to a main processing unit 70 that comprises despreader 71, a decoder 72 and an input output data port 73 in the reception path as well as an encoder 75 and spreader 74 in the transmission path. The main processing unit 70 further comprises a control unit 76 for exchanging a control signal with a media access controller (MAC) 80. The media access controller 80 further receives and transmits a data signal to the input/output data port 73 and communicates with other parts, of the wireless LAN station or access point, e.g. with a personal computer.

The pre-processing unit 60 may comprise further circuits as indicated by the dotted lines in the reception path. In such further embodiments there may for example be provided a radio frequency to intermediate frequency (RF/IF) converter either within the main processing unit 70 or the pre-processing unit 60. Furthermore, the pre-processing unit 60 may include a Binary-Phase-Shift-Keying unit and/or a Quadratur-Phase-Shift-Keying unit.

In the transceiver of FIG. 5, RF signals for instance in the 2,4 GHz band may be used for data transmission. IEEE 802.11b provides a standard for using high data rates of 5,5 and 11 Mbps by using DSSS as a modulation method and complementary code keying (CCK) as a coding technique. Although the above processing device has been described in the context of a Spread Spectrum modulation technique, other wireless LAN processing devices may as well use other modulation or coding techniques and implementation features. In these embodiments, the devices will still be IEEE 802.11b compliant although the invention is not restricted to this standard.

It is noted that other embodiments of the power normalization unit 30 illustrated in any of the above described figures are possible in which normalization functions are applied for normalizing the signal level. For instance, the average mean square value of the digital signal may be used, or any parameter suitable to provide a normalized digital signal adapted to certain signal quality requirements.

The embodiments described above may allow use of less precise AGC units thereby reducing production costs and even more important also reducing the size and complexity of the AGC unit. Furthermore, shorter circuit development times for wireless LAN devices and DSP units may be obtained by using a flexible power normalization unit which is adaptable to specific requirements. Finally, flexibility in the selection of components for wireless LAN devices is significantly improved since basically any AGC unit may be combined with any DSP unit.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A signal pre-processing device for providing a digital output signal based on an analog input signal, the device comprising:
   an AGC (Automatic Gain Control) unit for receiving said analog input signal, amplifying said analog input signal and outputting an amplified analog signal, the AGC unit being arranged for automatically controlling an amplification gain when amplifying said analog input signal;
   an ADC (Analog-to-Digital Converting) unit connected to said AGC unit, for receiving said amplified analog signal, converting said received amplified analog signal into a digital signal and outputting said digital signal; and
   a normalization unit connected to said ADC unit, for receiving said digital signal, applying a normalization function to said digital signal and outputting a normalized digital signal.

2. The signal pre-processing device according to claim 1, wherein said normalization unit comprises:
   a normalization control unit for providing a normalization control signal based on a target signal level and a signal level of said digital signal; and
   a multiplication unit for receiving said digital signal and said normalization control signal for multiplying said digital signal with a multiplication value derived from said received normalization control signal.

3. The signal pre-processing device according to claim 2, wherein said normalization unit further comprises:
   a signal evaluation unit for receiving said digital signal, determining said signal level of said digital signal and providing said signal level to said normalization control unit,
   wherein said normalization control unit is arranged for comparing said signal level received from said signal evaluation unit with said target signal level for generating said normalization control signal.

4. The signal pre-processing device according to claim 2, wherein said normalization unit further comprises a storage unit for storing said target signal level.

5. The signal pre-processing device according to claim 1, wherein said target signal level is selected to be an optimized input signal level of a DSP (Digital Signal Processing) unit connected to said signal pre-processing device to receive said normalized digital signal therefrom.

6. The signal pre-processing device according to claim 1, wherein said normalization unit is arranged for adapting said normalization function to at least one predetermined property of said AGC unit.

7. The signal pre-processing device according to claim 1, wherein said normalization unit is arranged for adapting said normalization function to at least one predetermined property of said ADC unit.

8. The signal pre-processing device according to claim 1, wherein said normalization unit is arranged for receiving a control value indicating the current state of said AGC unit and for adapting said normalization function to said control value.

9. The signal pre-processing device according to claim 1, wherein said normalization unit is arranged for considering a theoretical maximum bit width of said digital signal when applying said normalization function, said maximum bit width being adaptable to properties of said AGC unit and/or said ADC unit.

10. The signal pre-processing device according to claim 1, wherein said normalization unit is arranged for using, when initially applying said normalization function, a default normalization control signal, said default normalization control signal being adaptable to properties of said AGC unit and/or said ADC unit.

11. The signal pre-processing device according to claim 1, wherein said normalization unit is a power normalization unit for determining an average power level of said digital signal and compensating deviations of said average power level from a target power level.

12. The signal pre-processing device according to claim 1, wherein said normalization unit is arranged to limit the bit-width of said normalized digital signal.

13. A wireless LAN (Local Area Network) access point comprising:
   an AGC (Automatic Gain Control) unit for receiving an analog input signal, amplifying said analog input signal and outputting an amplified analog signal, the AGC unit being arranged for automatically controlling an amplification gain when amplifying said analog input signal;
   an ADC (Analog-to-Digital Converting) unit connected to said AGC unit, for receiving said amplified analog signal, converting said received amplified analog signal into a digital signal and outputting said digital signal; and
   a normalization unit connected to said ADC unit, for receiving said digital signal, applying a normalization function to said digital signal and outputting a normalized digital signal.

14. A wireless LAN (Local Area Network) station comprising:
   an AGC (Automatic Gain Control) unit for receiving an analog input signal, amplifying said analog input signal and outputting an amplified analog signal, the AGC unit being arranged for automatically controlling an amplification gain when amplifying said analog input signal;
   an ADC (Analog-to-Digital Converting) unit connected to said AGC unit, for receiving said amplified analog signal, converting said received amplified analog signal into a digital signal and outputting said digital signal; and
   a normalization unit connected to said ADC unit, for receiving said digital signal, applying a normalization function to said digital signal and outputting a normalized digital signal.

15. A wireless LAN (Local Area Network) receiver comprising:
- an antenna for receiving a radio signal and outputting a corresponding analog signal;
- an AGC (Automatic Gain Control) unit for receiving said analog signal, amplifying said analog signal and outputting an amplified analog signal, the AGC unit being arranged for automatically controlling an amplification gain when amplifying said analog signal;
- an ADC (Analog-to-Digital Converting) unit connected to said AGC unit, for receiving said amplified analog signal, converting said received amplified analog signal into a digital signal and outputting said digital signal; and
- a normalization unit connected to said ADC unit, for receiving said digital signal, applying a normalization function to said digital signal and outputting a normalized digital signal.

16. The wireless LAN receiver according to claim 15, wherein said normalization unit comprises:
- a normalization control unit for providing a normalization control signal based on a target signal level and a signal level of said digital signal; and
- a multiplication unit for receiving said digital signal and said normalization control signal and multiplying said digital signal with a multiplication value derived from said received normalization control signal.

17. The wireless LAN receiver according to claim 16, wherein said normalization unit further comprises:
- a signal evaluation unit for receiving said digital signal, determining said signal level of said digital signal and providing said signal level to said normalization control unit,
- wherein said normalization control unit is arranged for comparing said signal level received from said signal evaluation unit with said target signal level for generating said normalization control signal.

18. The wireless LAN receiver according to claim 16, wherein said normalization unit further comprises a storage unit for storing said target signal level.

19. The wireless LAN receiver according to claim 15, wherein said target signal level is selected to be an optimized input signal level of a DSP (Digital Signal Processing) unit connected to said signal pre-processing device to receive said normalized digital signal therefrom.

20. The wireless LAN receiver according to claim 15, wherein said normalization unit is arranged for adapting said normalization function to at least one predetermined property of said AGC unit.

21. The wireless LAN receiver according to claim 15, wherein said normalization unit is arranged for adapting said normalization function to at least one predetermined property of said ADC unit.

22. The wireless LAN receiver according to claim 15, wherein said normalization unit is arranged for receiving an control value indicating the current state of said AGC unit and for adapting said normalization function to said control value.

23. The wireless LAN receiver according to claim 15, wherein said normalization unit is arranged for considering a theoretical maximum bit width of said digital signal when applying said normalization function, said maximum bit width being adaptable to properties of said AGC unit and/or said ADC unit.

24. The wireless LAN receiver according to claim 15, wherein said normalization unit is arranged for using, when initially applying said normalization function, a default normalization control signal, said default normalization control signal being adaptable to properties of said AGC unit and/or said ADC unit.

25. The wireless LAN receiver according to claim 15, wherein said normalization unit is a power normalization unit for determining an average power level of said digital signal and compensating deviations of said average power level from a target power level.

26. The wireless LAN receiver according to claim 16, wherein said normalization unit is arranged to limit the bit-width of said normalized digital signal.

27. A signal processor for processing an analog input signal comprising:
- an AGC (Automatic Gain Control) unit for receiving said analog input signal, amplifying said analog input signal and outputting an amplified analog signal, the AGC unit being arranged for automatically controlling an amplification gain when amplifying said analog input signal;
- an ADC (Analog-to-Digital Converting) unit connected to said AGC unit, for receiving said amplified analog signal, converting said received amplified analog signal into a digital signal and outputting said digital signal;
- a normalization unit connected to said ADC unit, for receiving said digital signal, applying a normalization function to said digital signal and outputting a normalized digital signal; and
- a DSP (Digital Signal Processing) unit connected to said normalization unit, for receiving said normalized digital signal and digitally processing said normalized digital signal.

28. The signal processor according to claim 27, wherein said normalization unit comprises:
- a normalization control unit for providing a normalization control signal based on a target signal level and a signal level of said digital signal; and
- a multiplication unit for receiving said digital signal and said normalization control signal and multiplying said digital signal with a multiplication value derived from said received normalization control signal.

29. The signal processor according to claim 28, wherein said normalization unit further comprises:
- a signal evaluation unit for receiving said digital signal, determining said signal level of said digital signal and providing said signal level to said normalization control unit,
- wherein said normalization control unit is arranged for comparing said signal level received from said signal evaluation unit with said target signal level for generating said normalization control signal.

30. The signal processor according to claim 28, wherein said normalization unit further comprises a storage unit for storing said target signal level.

31. The signal processor according to claim 27, wherein said target signal level is selected to be an optimized input signal level of a DSP (Digital Signal Processing) unit connected to said signal pre-processing device to received said normalized digital signal therefrom.

32. The signal processor according to claim 27, wherein said normalization unit is arranged for adapting said normalization function to at least one predetermined property of said AGC unit.

33. The signal processor according to claim 27, wherein said normalization unit is arranged for adapting said normalization function to at least one predetermined property of said ADC unit.

34. The signal processor according to claim 27, wherein said normalization unit is arranged for receiving a control value indicating the current state of said AGC unit and for adapting said normalization function to said control value.

35. The signal processor according to claim 27, wherein said normalization unit is arranged for considering a theoretical maximum bit width of said digital signal when applying said normalization function, said maximum bit width being adaptable to properties of said AGC unit and/or said ADC unit.

36. The signal processor according to claim 27, wherein said normalization unit is arranged for using, when initially applying said normalization function, a default normalization control signal, said default normalization control signal being adaptable to properties of said AGC unit and/or said ADC unit.

37. The signal processor according to claim 27, wherein said normalization unit is a power normalization unit for determining an average power level of said digital signal and compensating deviations of said average power level from a target power level.

38. The signal processor according to claim 27, wherein said normalization unit is arranged to limit the bit-width of said normalized digital signal.

39. A method for pre-processing an analog input signal in a wireless LAN reception device, the method comprising:
receiving the analog input signal;
amplifying said analog input signal, thereby automatically controlling an amplification gain;
converting said amplified analog signal to a digital signal;
applying a normalization function to said digital signal to provide a normalized digital signal; and
outputting said normalized digital signal.

* * * * *